United States Patent [19]

Noguchi

[11] Patent Number: 5,767,003
[45] Date of Patent: Jun. 16, 1998

[54] THIN FILM SEMICONDUCTOR DEVICE MANUFACTURING METHOD

[75] Inventor: Takashi Noguchi, Kanagawa, Japan

[73] Assignee: Sony Corporation, Tokyo, Japan

[21] Appl. No.: 715,169

[22] Filed: Sep. 17, 1996

[30] Foreign Application Priority Data

Sep. 19, 1995 [JP] Japan .................................. 7-264999

[51] Int. Cl.$^6$ .................................................. H01L 21/20
[52] U.S. Cl. ............................................................. 438/487
[58] Field of Search .................................. 437/173, 174; 148/DIG. 90–93; 117/904; 438/487

[56] References Cited

U.S. PATENT DOCUMENTS

| | | | |
|---|---|---|---|
| 5,336,641 | 8/1994 | Fair | 437/248 |
| 5,352,291 | 10/1994 | Zhang | 117/8 |
| 5,432,122 | 7/1995 | Chae | 437/101 |
| 5,612,251 | 3/1997 | Lee | 437/173 |

Primary Examiner—John Niebling
Assistant Examiner—Brendan Mee
Attorney, Agent, or Firm—Hill & Simpson

[57] ABSTRACT

A method for carrying out crystallization by annealing with good throughput on a large-area semiconductor thin film to constitute an active layer of thin film transistors integrally formed in a thin film semiconductor device. To manufacture a thin film semiconductor device, an amorphous semiconductor thin film is first formed on the surface of an insulating substrate 1 extending in the longitudinal direction and the cross direction, which are mutually orthogonal. An annealing step is then carried out wherein energy is applied from outside to transform the semiconductor thin film 2 from amorphous to polycrystalline form. Thin film transistors are then formed using this semiconductor thin film 2 as an active layer. In the annealing step, a line-shaped ultraviolet beam 23 extending in the cross direction of the insulating substrate 1 and of relatively low energy is radiated at the insulating substrate 1 from the rear side thereof and a line-shaped laser beam 4 also extending in the cross direction of the insulating substrate 1 and of relatively high energy is radiated at the insulating substrate 1 from the front side thereof and in alignment with the area irradiated by the ultraviolet beam 23. At this time, the insulating substrate 1 is moved relative to the irradiated area in the X direction. The same method can also be used in a source/drain region activating step for activating an impurity doped into a semiconductor thin film to form source and drain regions of thin film transistors.

14 Claims, 3 Drawing Sheets

THIN FILM SEMICONDUCTOR DEVICE MANUFACTURING METHOD

BACKGROUND OF THE INVENTION

This invention relates to a method for manufacturing a thin film semiconductor device in which are integrally formed thin film transistors having as an active layer a semiconductor thin film formed on an insulating substrate, and particularly to a laser irradiation technique (crystallization by annealing) carried out to crystallize a semiconductor thin film formed on an insulating substrate.

As part of a method for making the process of manufacturing a semiconductor thin film device a low temperature process, crystallization by annealing using laser light has been being developed. In this process, a non-monocrystalline semiconductor thin film of amorphous silicon or polycrystalline silicon or the like formed on an insulating substrate is locally heated by being irradiated with a laser beam and then crystallized in the course of subsequent cooling. Thin film transistors are then integrally formed with this crystallized semiconductor thin film as an active layer (channel regions). In the irradiation step, generally, pulse irradiation is carried out intermittently with a line-shaped laser beam being made to partially overlap itself in a scanning direction. By making the laser beam overlap itself, crystallization of the semiconductor thin film can be carried out relatively uniformly.

Thin film semiconductor devices are ideal for use in driving substrates of active matrix displays and the like, and for this reason their development has been being advanced vigorously in recent years. There is a strong demand for transparent insulating substrates used in displays to be made larger and cheaper, and the above-mentioned crystallization by annealing using a laser beam has been receiving attention as a way of achieving this. With laser irradiation, because it is possible to crystallize a semiconductor thin film at a relatively low temperature, it is possible to use a relatively low-cost transparent insulating substrate made of low melting point glass or the like. Also, by scanning with a line-shaped laser beam and irradiating in overlapping pulses, it is possible to transform a semiconductor thin film of a relatively large surface area from amorphous to polycrystalline form with good throughput. However, even with crystallization by annealing using a line-shaped laser beam there has been a limit to how large the area of the semiconductor thin film can be made, this limit being dependent on the energy output of the laser. For example, when an excimer laser having a total energy output of 1J is used, if an irradiated energy density of 500 mJ/cm² is necessary for crystallization, the cross-sectional shape of the laser beam becomes approximately 1 mm×200 mm. With this, it is not possible to carry out crystallization by annealing on an insulating substrate of a large area whose width dimension exceeds 200 mm with good throughput. Thus, how large the area of the substrate can be made depends on the output of the laser, but at present no practical excimer laser capable of high-speed (around 150 Hz) pulse irradiation and of an output exceeding 1J, 200 W is available and consequently there has been a limit on the length dimension of the line-shaped laser beam. In practice, it has been difficult to use a line-shaped laser beam more than 300 mm in length. If the length dimension of a line-shaped laser beam is made longer in the absence of a corresponding increase in output, the energy density (mJ/cm²) of the beam decreases and it becomes impossible to carry out crystallization by annealing satisfactorily.

To solve this problem, techniques whereby the insulating substrate is pre-heated using a heater or the like to assist crystallization by annealing using a laser beam have been proposed. Generally, to crystallize amorphous silicon it is necessary to heat it to a temperature of 600° C. or over. Accordingly, if pre-heating of the substrate is carried out and the substrate temperature is thereby raised to about 400° C., the energy density of the laser beam can be reduced correspondingly and there are also beneficial effects on the crystallinity and the uniformity of the semiconductor thin film. Furthermore, because the energy density can be reduced, the cross-sectional area of the laser beam can be increased by a corresponding amount. However, with pre-heating methods using a heater a considerable time is needed to raise the insulating substrate to the required temperature, and consequently there have been problems of inadequate throughput. For example, to raise the temperature of an insulating substrate made of ordinary glass or the like to 400° C., a pre-heating time of about 25 minutes has been required.

So-called lamp annealing, wherein instead of substrate pre-heating (furnace annealing) using a heater (an electric furnace) pre-heating is carried out by the whole substrate being irradiated at once with light from a lamp, has also been proposed. Generally, in lamp annealing, a halogen lamp whose light includes a large amount of infrared light has been used, but although with a halogen lamp it is possible to heat a silicon wafer used in ordinary IC manufacturing, a silicon film formed on an insulating substrate made of glass or the like absorbs almost no infrared light and consequently does not heat up. Instead of a halogen lamp it is also possible to use a xenon ark lamp whose light includes a large amount of ultraviolet light. However, even with a xenon ark lamp it has been difficult to rapidly raise the temperature of a thin silicon film to 400° C. with an overall irradiation. Heating the whole of a silicon film of a large area at once places too much burden on the xenon ark lamp constituting the light source and is therefore not practical.

SUMMARY OF THE INVENTION

An object of the present invention is to solve the problems of the related art technology described above and provide a semiconductor device manufacturing method by which it is possible to crystallize a semiconductor thin film of a large area formed on an insulating substrate made of an inexpensive glass efficiently and with good throughput.

To achieve this object and other objects, according to the invention, a thin film semiconductor device is manufactured by the following process: Basically, first a film-forming step is carried out whereby an amorphous semiconductor thin film is formed on the surface of an insulating substrate extending in mutually orthogonal longitudinal and cross directions. An annealing step is then carried out wherein energy is applied from outside and the semiconductor thin film is thereby transformed from amorphous to polycrystalline form (crystallization by annealing). After that, processing steps are carried out whereby thin film transistors are formed by lamination using the semiconductor thin film as an active layer. A characteristic feature of the invention is that this annealing step comprises radiating a line-shaped ultraviolet beam extending in the cross direction of the insulating substrate and of a relatively low energy from the rear side of the insulating substrate while radiating a line-shaped laser beam extending in the cross direction of the insulating substrate and of a relatively high energy from the front side of the insulating substrate and substantially in alignment with the area being irradiated by the ultraviolet beam and moving the insulating substrate in the longitudinal direction of the insulating substrate relative to this irradiated area. Preferably, in this annealing step the ultraviolet beam is radiated using a xenon ark lamp and the laser beam is radiated using an excimer laser. Also, preferably, the ultraviolet beam is radiated continuously and the laser beam is radiated intermittently in partially overlapping pulses.

In this invention, a semiconductor thin film of amorphous silicon or the like formed on a transparent insulating substrate made of glass or the like is crystallized by annealing by means of a laser beam. At this time, while a line-shaped ultraviolet beam is radiated at the transparent insulating substrate from the rear side thereof, a line-shaped laser beam is radiated at the insulating substrate from the front side thereof, on which the semiconductor thin film is formed. By the insulating substrate being scanned (shifted) relative to an area being irradiated from the front and rear sides by the ultraviolet beam and the laser beam in alignment, it is possible to perform crystallization by annealing of a semiconductor thin film of amorphous silicon or the like formed on a transparent insulating substrate of large area with good efficiency. Because irradiation is carried out locally with the ultraviolet beam concentrated into a line-shaped area it is possible to heat the semiconductor thin film to a required temperature in an extremely short time and throughput is good. Because pre-heating is being carried out the laser irradiation energy density can be lower than in the related art and it is possible to enlarge the cross-sectional shape of the laser beam by a corresponding amount. As a result, it is possible to carry out crystallization by annealing on an insulating substrate of a large area easily. In other words, crystallization annealing of a large area is made possible by utilizing the energy of the laser beam efficiently. Since the cross-sectional shape of the laser beam can be enlarged, throughput can also be increased by a corresponding amount.

Furthermore, an annealing method according to this invention, i.e. radiating an ultraviolet beam at a substrate from the rear side thereof while simultaneously radiating a laser beam at the substrate from the front side thereof and in alignment with the ultraviolet beam, can also be used for example in a source/drain region activating step of activating an impurity after it is doped into a semiconductor thin film to form source and drain regions of thin film transistors. In this case, because it is not necessary to make large crystals as in the case of crystallization annealing, a smaller overall energy is used than in the case of crystallization annealing.

DETAILED DESCRIPTION OF THE PREFERRED EMBODIMENTS

A preferred embodiment of the invention will now be described with reference to the accompanying drawings.

Figure 1:
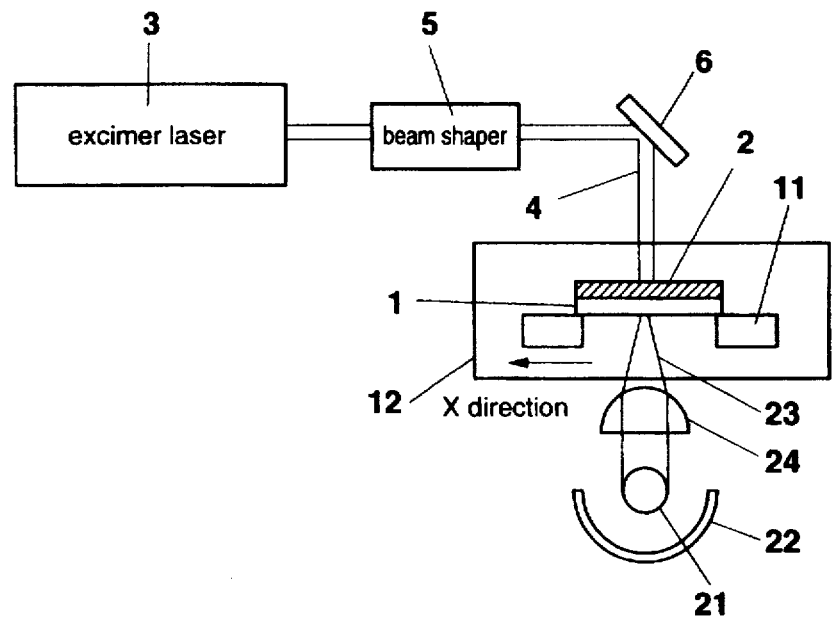
FIG. 1 is a view illustrating a thin film semiconductor device manufacturing method according to the invention.

FIG. 1 is a schematic view showing a laser beam irradiation step (crystallization annealing) constituting a main part of a thin film semiconductor device manufacturing method according to the invention. When crystallization annealing is carried out, an insulating substrate 1 made of a low melting point glass or the like is placed in an annealing chamber 12 in which is installed an XY stage 11. At this time, a non-monocrystalline semiconductor thin film 2 has already been formed on the surface of this insulating substrate 1. As the semiconductor thin film 2, for example amorphous silicon is formed by P-CVD. Inside this annealing chamber 12, the insulating substrate 1 is irradiated with a laser beam 4 emitted from for example an XeCl excimer laser 3. This melts the amorphous silicon and causes it to crystallize in the course of cooling and transform into polycrystalline silicon. As a result, the electrical characteristics of the thin film transistors obtained are improved. A beam shaper 5 is disposed in the path of the laser beam 4 to shape the cross-section of the laser beam 4 into a line shape and also to maintain uniformity of the strength of the beam energy over its cross-section. The line-shaped laser beam 4 having passed through the beam shaper 5 is reflected by a reflecting mirror 6 and then radiated onto the insulating substrate 1 inside the annealing chamber 12. During the laser irradiation, the XY stage 11 is moved in the X direction. As a result, the insulating substrate 1 is scanned by the laser beam 4 relatively in the X direction.

A characteristic feature of the invention is that a xenon ark lamp 21 is disposed facing the rear side of the insulating substrate 1. The xenon ark lamp 21 is received in a reflecting mirror 22. An ultraviolet beam 23 emitted from the xenon ark lamp 21 and the reflecting mirror 22 is converged into a line shape by a cylindrical lens 24 and then radiated onto the rear side of the insulating substrate 1 through a window provided in the bottom of the annealing chamber 12. In this way, in this invention, crystallization annealing is carried out by the insulating substrate 1 with the semiconductor thin film 2 formed thereon being irradiated from the front side by the line-shaped laser beam 4 and from the rear side by the similarly line-shaped ultraviolet beam 23.

Figure 2:
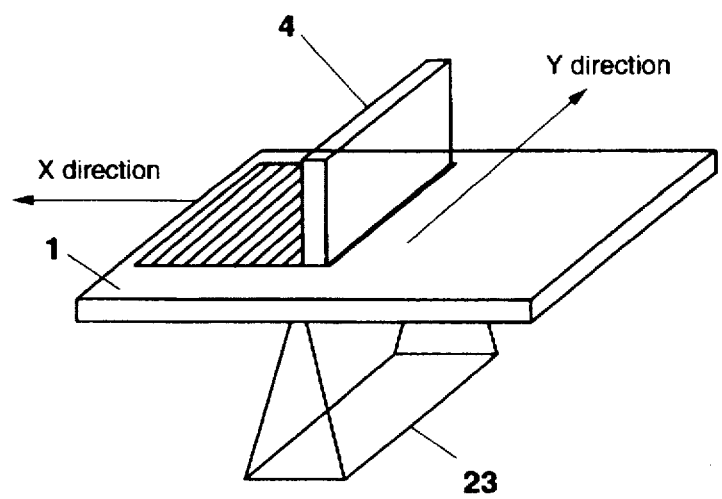
FIG. 2 is a schematic perspective view illustrating a crystallization annealing step of a thin film semiconductor device manufacturing method according to the invention.

FIG. 2 is a schematic perspective view illustrating the crystallization annealing described above more specifically. The ultraviolet beam 23, which is of a line shape extending in the cross direction (the Y direction) of the insulating substrate 1 and is of a relatively low energy, is radiated from the rear side of the insulating substrate 1. The laser beam 4, which is also of a line shape extending in the cross direction (the Y direction) of the insulating substrate 1 and is of a relatively high energy, is radiated from the front side of the insulating substrate 1 and substantially in alignment with the area irradiated by the ultraviolet beam 23. At this time the insulating substrate 1 is moved in its longitudinal direction (the X direction) relative to this irradiated area. In this example, the ultraviolet beam 23 emitted from the xenon ark lamp 21 is radiated continuously and the laser beam 4 emitted from the XeCl excimer laser 3 is radiated intermittently in partially overlapping pulses. That is, the insulating substrate 1 is shifted by the XY stage 11 in the X direction relative to the laser beam 4 and the ultraviolet beam 23. The insulating substrate 1 is moved after every shot of the laser beam 4 through a pitch smaller than the width dimension of the line-shaped laser beam 4, and crystallization annealing is thereby so carried out that the whole of the insulating substrate 1 can be irradiated with laser beam 4 and the ultraviolet beam 23.

Figure 3:
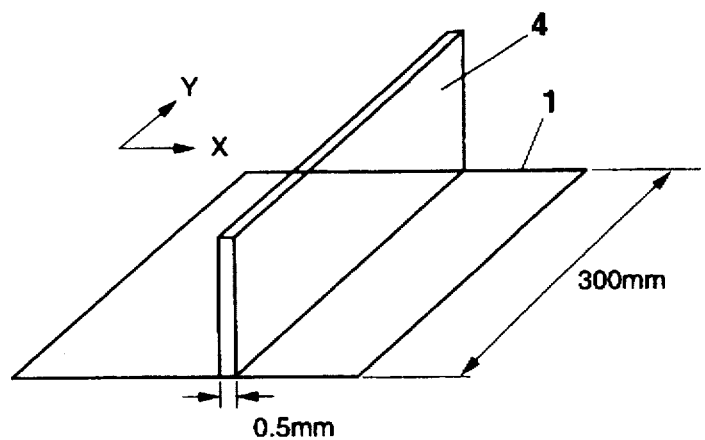
FIG. 3 is a schematic view showing a specific example of crystallization by annealing.

Specific conditions of the crystallization annealing will now be described with reference to FIG. 3. As described above, in this invention, to assist heating of the semiconductor thin film by the laser beam 4, an ultraviolet beam emitted from an ultraviolet light source such as a xenon ark lamp is converged into line shape and radiated onto the semiconductor thin film from the rear side. For example a relatively low-cost heat-resistant glass (Hoya Glass NA35) is used for the transparent insulating substrate and a semiconductor thin film made of amorphous silicon is deposited thereon to a thickness of about 30 nm. An XeCl excimer laser beam having a wavelength of 308 nm is shaped into a line shape and radiated from the front side of this insulating substrate 1, and an ultraviolet beam (not shown) from a xenon ark lamp is similarly converged into line shape and radiated from the rear side of the insulating substrate 1. In this example the ultraviolet beam is radiated continuously and the laser beam is radiated in alignment with the region irradiated by the ultraviolet beam and in pulses repeated at high speed. It is structurally advantageous if both of the light sources are made stationary and the insulating substrate 1 is moved in the X direction as described above. After the semiconductor thin film is crystallized, thin film transistors are integrally formed by an ordinary TFT manufacturing process at process temperatures below 600° C. The laser beam 4 is shaped into a line shape of for example 300 mm×0.5 mm, and the irradiation energy density is set to 350 mJ/cm$^2$. The pulse width of the laser beam is for example about 40 nsec, and pulse irradiation is carried out at a cycle frequency of about 150 Hz. At this time, the line-shaped laser beam is radiated in pulses overlapping by about 20%. The output of the xenon ark lamp is set so that the peak temperature in the irradiated area of the insulating substrate is for example 400° C.

Figure 4:
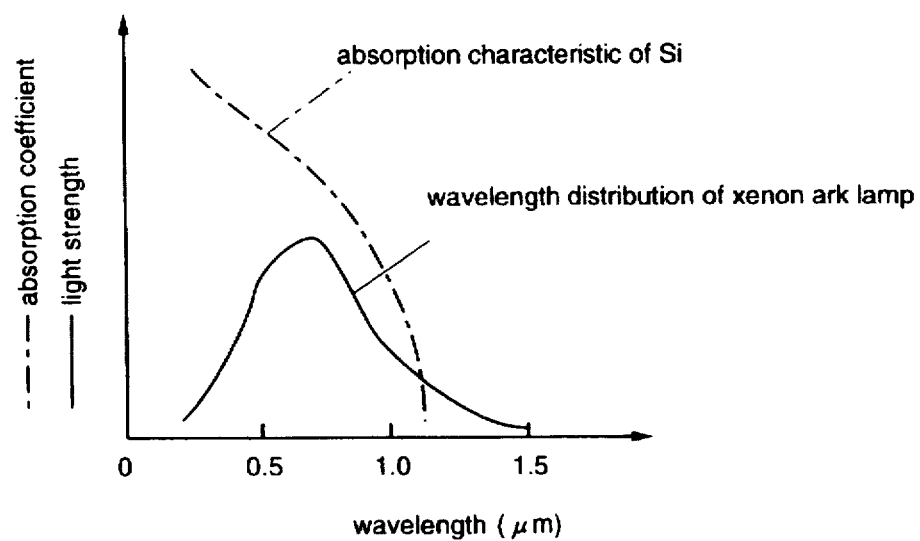
FIG. 4 is a graph showing the light absorption characteristic of silicon and a wavelength distribution of a xenon lamp.

FIG. 4 is a graph showing the light absorption characteristic of silicon (Si) (the broken line) and the wavelength distribution of a xenon ark lamp (the solid line). The horizontal axis is wavelength (μm) and the vertical axis is light strength and absorption coefficient on different scales. Light emitted from a xenon ark lamp has the kind of wavelength distribution shown by the solid line in the graph, and wavelength components below 1 μm constitute most of this light. Consequently, as is clear from the graph, the efficiency with which this light is absorbed by Si is very high. Therefore, the temperature rise of a semiconductor thin film when it is pre-heated with a xenon ark lamp is very sharp. With a halogen lamp, on the other hand, although it is possible to carry out high-temperature heat treatment of a silicon wafer or the like in a short time, light from a halogen lamp is infrared. Consequently, the absorption efficiency with a semiconductor thin film made of Si or the like is poor, and it is not possible to carry out heating in a short time.

Figure 5:
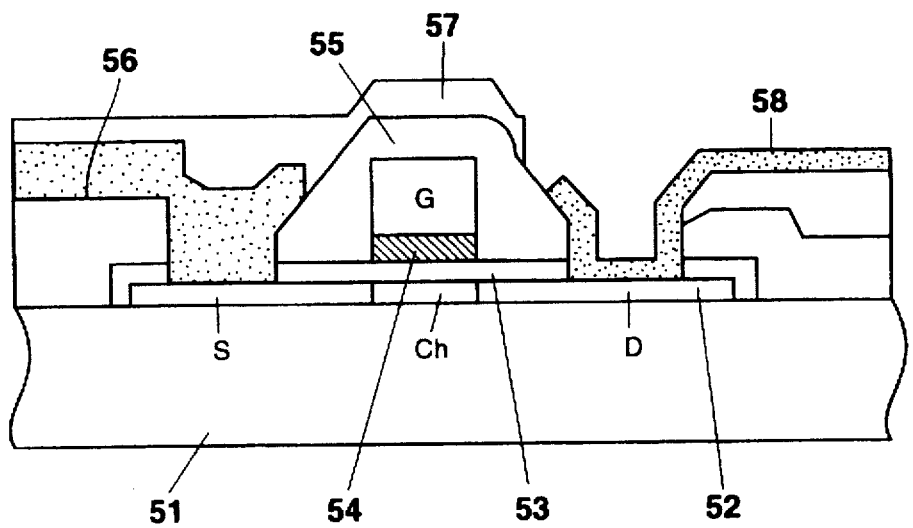
FIG. 5 is a sectional view showing an example of a thin film semiconductor device manufactured according to the invention.

FIG. 5 is a schematic sectional view showing an example of a thin film semiconductor device manufactured according to the invention. A semiconductor thin film 52 is patterned into a predetermined shape on the surface of an insulating substrate 51 and constitutes a device region. This semiconductor thin film 52 is one which has been crystallized by annealing according to the invention. Therefore, the semiconductor thin film 52 has a uniform polycrystalline structure and has excellent characteristics as an active layer of a thin film transistor. A source region S and a drain region D in which an impurity has been diffused to a high concentration are formed in the semiconductor thin film 52, and a channel region Ch is provided between the two. A gate electrode G is formed above the channel region Ch with a gate oxide film 53 and a gate nitride film 54 interposed therebetween, whereby a thin film transistor is constituted. This thin film transistor has superior mobility μ and threshold voltage Vth characteristics. This thin film transistor is covered by a first interlayer insulating film 55. A signal interconnection 56 is electrically connected to the source region S through a first contact hole provided in this first interlayer insulating film 55. A second interlayer insulating film 57 is formed on the first interlayer insulating film 55. A pixel electrode 58 consisting of a transparent conducting film of ITO or the like is patterned on this second interlayer insulating film 57 and is electrically connected to the drain region D of the thin film transistor through a second contact hole. A thin film semiconductor device having this construction is used for example as a driving substrate of an active matrix display.

Figure 6:
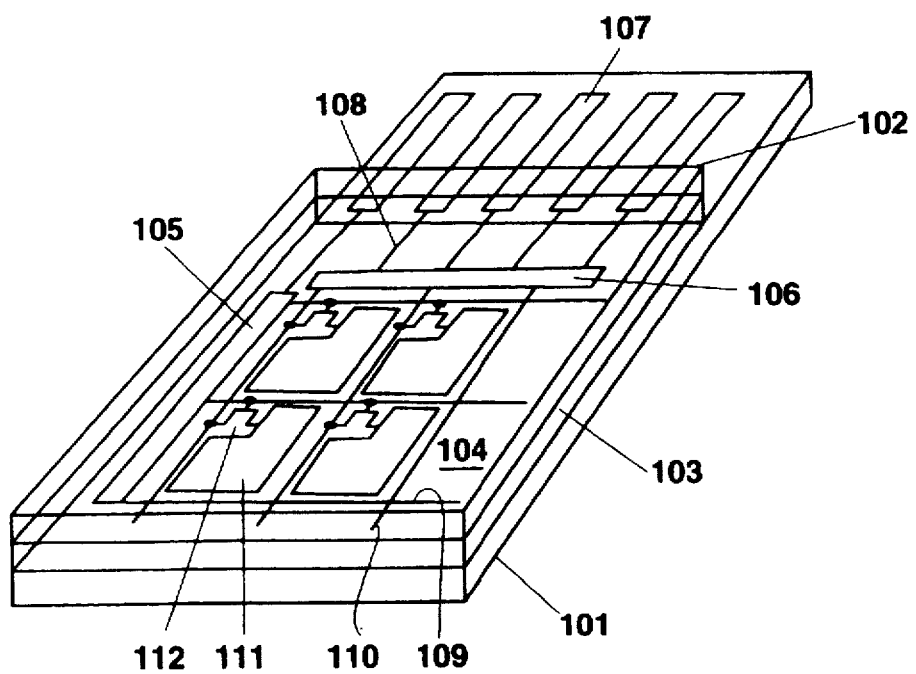
FIG. 6 is a perspective view showing an example of an active matrix display comprising the thin film semiconductor device shown in FIG. 5 as a driving substrate.

Finally, with reference to FIG. 6, an example of an active matrix display manufactured according to the invention will be briefly described. This display 101 has a panel structure comprising a driving substrate 101 and an opposing substrate 102 and an electro-optical substance 103 held between the two. As the electro-optical substance 103, liquid crystal materials and the like are widely used. The driving substrate 101 can be made large in area and also can be made using a relatively low-cost glass or the like. A pixel array part 104 and a driving circuit part are integrally formed on the driving substrate 101, and a monolithic structure can be employed. That is, it is possible to build in the peripheral driving circuit part integrally in addition to the pixel array part 104. The driving circuit part is divided into a vertical driving circuit 105 and a horizontal driving circuit 106. Also, a terminal part 107 for outside connections is formed on the upper side of a peripheral part of the driving substrate 101. The terminal part 107 is connected to the vertical driving circuit 105 and the horizontal driving circuit 106 by interconnections 108. Opposing electrodes (not shown) are formed over the entire inner surface of the opposing substrate 102. Column-like gate lines 109 and row-like signal lines 110 are formed on the pixel array part 104. The gate lines 109 are connected to the vertical driving circuit 105, and the signal lines 110 are connected to the horizontal driving circuit 106. Pixel electrodes 111 and thin film transistors 112 for driving these are integrally formed at the intersections of the interconnections 108 and the gate lines 109. Thin film transistors are also integrally formed in the vertical driving circuit 105 and the horizontal driving circuit 106.

As described above, according to this invention, a semiconductor thin film made of amorphous silicon or the like formed on an insulating substrate made of glass or the like is crystallized by annealing with a laser beam. Pulse irradiation with a line-shaped excimer laser beam is carried out from the front side of the insulating substrate, and preheating by irradiation with a line-shaped ultraviolet beam is carried out from the rear side of the insulating substrate. The insulating substrate is scanned (shifted) relative to an irradiation area in which the laser beam and the ultraviolet beam are mutually aligned, and crystallization annealing of a semiconductor thin film formed on an insulating substrate of large area is thereby realized. Thin film transistors can be integrally formed with high throughput on a large-area and low-cost insulating substrate made of glass or the like, and it is possible to make a monolithic type active matrix display with peripheral driving circuits built in. Also, whereas with just scanning irradiation with a laser beam the crystal particles of the crystallized semiconductor thin film become nonuniform, because in this invention substrate preheating by means of ultraviolet beam irradiation is carried out also the particle uniformity can be improved and it is possible to make the microcrystalline structure of the thin film uniform. Also, because the crystallinity improves as a result of the pre-heating, characteristics such as the carrier mobility and the threshold value of the thin film transistor are improved and it is therefore possible to contribute to increasing the definition of an active matrix display.

Furthermore, an annealing method according to this invention, that is, radiating an ultraviolet beam at a substrate from the rear side thereof while simultaneously radiating a laser beam at the substrate from the front side thereof and in alignment with the ultraviolet beam, can also be used for example in a step of activating an impurity doped into a semiconductor thin film to form source and drain regions of thin film transistors (a source/drain region activating step).

What is claimed is:

1. A method for manufacturing a thin film semiconductor device, which comprises the steps of:

forming an amorphous semiconductor thin film on a surface of an insulating substrate:

radiating an ultraviolet beam in a first select region of a rear side of said insulating substrate at a first energy from a lamp while radiating a pulsed laser beam at a corresponding first select region of the thin film at a second energy higher than said first energy, at least a portion of said ultraviolet beam radiation area being located below the corresponding first select region of the thin film; and integrally forming a thin film transistor with said semiconductor thin film serving as an active layer of the thin film semiconductor device.

2. A method for manufacturing a thin film semiconductor device according to claim 1, wherein said laser beam is an excimer laser.

3. A method for manufacturing of a thin film semiconductor device according to claim 2, wherein said step of radiating the ultraviolet beam comprises radiating said ultraviolet beam continuously.

4. A method for manufacturing a thin film semiconductor device according to claim 1, comprising:

forming a semiconductor thin film on a surface of an insulating substrate;

forming an impurity doped region in the semiconductor thin film; and radiating an ultraviolet beam at a first energy on a rear side of the insulating substrate by using a lamp while radiating a pulsed laser beam at a second energy higher than said first energy on a top side of the insulating substrate to activate impurities of the impurity doped region.

5. A method for manufacturing a thin film semiconductor device according to claim 4, wherein said laser beam is an excimer laser.

6. A method for manufacturing a thin film semiconductor device according to claim 4, comprising radiating said ultraviolet beam continuously.

7. A method for manufacturing a thin film semiconductor device comprising the steps of:

forming an amorphous semiconductor thin film on a surface of an insulating substrate;

radiating an ultraviolet beam on a first select region of a rear side of said insulating substrate while simultaneously radiating a laser beam on a corresponding first select region of the thin film, wherein at least a portion of the corresponding first select region of the thin film is located above the first select region of the rear side; and ceasing the radiation of the ultraviolet beam on the first select region of the rear side substantially simultaneously upon finally ceasing radiation of the laser beam on the first select region of the thin film.

8. The method of claim 7, further comprising: a step of moving the laser beam and ultraviolet beam with respect to the substrate; and radiating the ultraviolet beam on a second select region of the rear side while simultaneously radiating the laser beam in a corresponding second select region of the thin film, and wherein at least a portion of the corresponding second select region of the thin film is located above the second select region of the rear side.

9. The method of claim 8, wherein at least a portion of the second select region of the thin film overlaps a portion of the first select region of the thin film.

10. The method of claim 8, wherein at least a portion of the second select region of the rear side overlaps a portion of the first select region of the rear side.

11. The method of claim 7, wherein the laser beam is intermittently radiated on the first select region of the thin film.

12. The method of claim 7, wherein the ultraviolet beam is continuously radiated on the first select region of the rear side.

13. A method for manufacturing a thin film semiconductor device, which comprises the steps of:

forming an amorphous semiconductor thin film on a surface of an insulating substrate;

without preheating said substrate, radiating an ultraviolet beam in a first select region of a rear side of said insulating substrate at a first energy while radiating a laser beam at a corresponding first select region of the thin film at a second energy higher than said first energy, at least a portion of said ultraviolet beam radiation area being located below the corresponding first select region of the thin film; and ceasing the radiation of the ultraviolet beam on the first select region of the rear side substantially simultaneously upon finally ceasing radiation of the laser beam on the first select region of the thin film.

14. A method for manufacturing a thin film semiconductor device according to claim 1, comprising:

a step of moving the laser beam and ultraviolet beam with respect to the substrate; and radiating the ultraviolet beam on a second select region of the rear side while simultaneously radiating the laser beam in a corresponding second select region of the thin film, and wherein at least a portion of the corresponding second select region of the thin film is located above the second select region of the rear side.

* * * * *